(12) United States Patent
Casperson

(10) Patent No.: US 8,058,546 B1
(45) Date of Patent: Nov. 15, 2011

(54) CONCENTRATING SOLAR COLLECTOR

(76) Inventor: John R. Casperson, Pensacola, FL (US)

( * ) Notice: Subject to any disclaimer, the term of this patent is extended or adjusted under 35 U.S.C. 154(b) by 317 days.

(21) Appl. No.: 12/231,940

(22) Filed: Sep. 8, 2008

Related U.S. Application Data

(60) Provisional application No. 60/994,108, filed on Sep. 17, 2007, provisional application No. 61/011,675, filed on Jan. 19, 2008.

(51) Int. Cl.
*H01L 31/042* (2006.01)
(52) U.S. Cl. ........ 136/246; 136/251; 136/259; 126/394; 126/684; 126/690; 250/203.4
(58) Field of Classification Search ............... 136/246, 136/251, 259; 126/694, 684, 690; 250/203.4
See application file for complete search history.

(56) References Cited

U.S. PATENT DOCUMENTS

| | | | |
|---|---|---|---|
| 4,003,638 A | 1/1977 | Winston | |
| 4,045,246 A | 8/1977 | Mlavsky et al. | |
| 4,065,053 A * | 12/1977 | Fletcher et al. | 237/1 R |
| 4,069,812 A | 1/1978 | O-Neill | |
| 4,175,391 A * | 11/1979 | Baer | 60/531 |
| 4,321,417 A | 3/1982 | Kurth et al. | |
| 4,784,700 A * | 11/1988 | Stern et al. | 136/248 |
| 5,096,505 A | 3/1992 | Fraas et al. | |
| 5,118,361 A | 6/1992 | Fraas et al. | |
| 5,123,968 A | 6/1992 | Fraas et al. | |
| 5,167,724 A | 12/1992 | Chiang | |
| 5,971,551 A | 10/1999 | Winston et al. | |
| 6,630,622 B2 | 10/2003 | Konold | |
| 2003/0221717 A1 * | 12/2003 | Dessel | 136/206 |
| 2005/0081908 A1 | 4/2005 | Stewart | |
| 2007/0113883 A1 | 5/2007 | Rhee et al. | |
| 2007/0193620 A1 * | 8/2007 | Hines et al. | 136/246 |
| 2007/0251569 A1 * | 11/2007 | Shan et al. | 136/246 |

OTHER PUBLICATIONS

Sala et al., "Test, Rating and Specification of PV Concentrator Components and Systems"(1999) pp. 28-47, http://www.ies-def.upm.es/ies/CRATING/Chapter4.pdf.
Najarian et al., "Thermoelectrics and Photovoltaics: Integration Challenges and Benefits" (Dec. 13, 2006) http://kammen.berkeley.edu/C226/5r.pdf.
Parker Automation., Hydraulic Rotary Actuators, Catalog 1800/USA, (1998 Parker Hannifin) pp. I-VI.
Cheknane et al., "Performance of concentrator solar cells with passive cooling" (Jan. 4, 2006 IOP Publishing, UK) Semicond. Sci. Technol., 21 (2006) 144-147.
Winston et al., "Nonimaging Optics", Chapter 4: Nonimaging Optical Systems, (2004) pp. 43-68 Elsevier, Boston.

* cited by examiner

*Primary Examiner* — Basia Ridley
*Assistant Examiner* — Thanh-Truc Trinh
(74) *Attorney, Agent, or Firm* — John R Casperson

(57) ABSTRACT

An apparatus is provided comprising a compound parabolic concentrating (CPC) trough, a target, a plurality of sunlight diverters, and a tracker. The CPC trough is for concentrating sunlight and is symmetric about an imaginary plane of symmetry. The target is for absorbing sunlight concentrated by the trough. The plurality of sunlight diverters is to increase the sunlight received by the trough. The tracker is to orient the trough so that the sun is positioned on the plane of symmetry.

11 Claims, 5 Drawing Sheets

CONCENTRATING SOLAR COLLECTOR

CROSS REFERENCES TO RELATED APPLICATIONS

This application claims the benefit of U.S. Provisional Application No. 60/994,108 filed Sep. 17, 2007 and U.S. Provisional Application No. 61/011,675 filed Jan. 19, 2008, the disclosures of which are incorporated by reference herein.

FIELD OF THE INVENTION

The invention relates to concentrating solar collectors.

BACKGROUND OF THE INVENTION

Conventional photovoltaic cells are more efficient at higher sun magnifications, if the cells can be kept cool. Cooling becomes very problematic at magnifications of over, say, 20 suns, so a device which provides sun multiplications in the range of, say, 7 to 20 suns, holds promise as a way to hold down cell costs and provide improved efficiency over conventional solar panels operating at 1 sun intensity.

Compound parabolic concentrators (CPCs) are well known and are the subject of numerous patents to Roland Winston. For example, see U.S. Pat. No. 4,045,246 and U.S. Pat. No. 4,003,638, the disclosures of which are incorporated by reference. In one form, the collectors comprise a long reflectively lined trough having an interior surface designed to accept incoming sunlight over a range of incoming angles and concentrate it to a receiver positioned in the bottom of the trough. Typically, the troughs provide sunlight to the bottom of the trough at 2 to 6 suns intensity.

One of the drawbacks to the use of a CPC which operates to concentrate the sun to, say, 6×, which would provide greater cell efficiency, and savings in cell costs, is their size. A 6×CPC trough having a 6 inch outlet and a 36 inch inlet would have a height of about 8 feet. In order to provide, say, 2000 watts of peak power, the trough would need a length of about 60 feet. A more compact device would be desirable. A device having a reduced sail area would be desirable. A device capable of practical operations at higher magnification would also be desirable.

OBJECTS OF THE INVENTION

It is an object of this invention to provide a device for concentrating sunlight.

It is a further object of this invention to provide a device for converting sunlight into electricity.

It is another object of this invention to provide a device which is efficient for its intended purpose.

It is another object of this invention to provide a device which is relatively inexpensive to produce.

It is another object of this invention to provide a device which is very durable.

It is another object of this invention to provide a device which is easily upgraded.

SUMMARY OF THE INVENTION

According to one embodiment of the invention, an apparatus is provided comprising a compound parabolic concentrating (CPC) trough, a target, a plurality of sunlight diverters, and a tracker. The CPC trough is for concentrating sunlight and is symmetric about an imaginary plane of symmetry. The target is for absorbing sunlight concentrated by the trough. The plurality of sunlight diverters is to increase the sunlight received by the trough. The tracker is to orient the trough so that the sun is positioned on the plane of symmetry.

One of the characteristics of a CPC trough is that it accepts and concentrates sunlight received within its acceptance angle. By pointing the trough at the sun and positioning the sunlight diverters above and laterally offset to the entry to the trough, and within the acceptance angles, the amount of sunlight collected by the trough can be multiplied, where the diverters bend the light toward the entry of the trough at an angle of no greater than the acceptance angle. Within its plane of symmetry, the trough is very tolerant of solar misalignments, so it can be deployed extending either N-S or E-W with a one-axis tracker with good results.

DETAILED DESCRIPTION OF THE INVENTION

Figure 1:
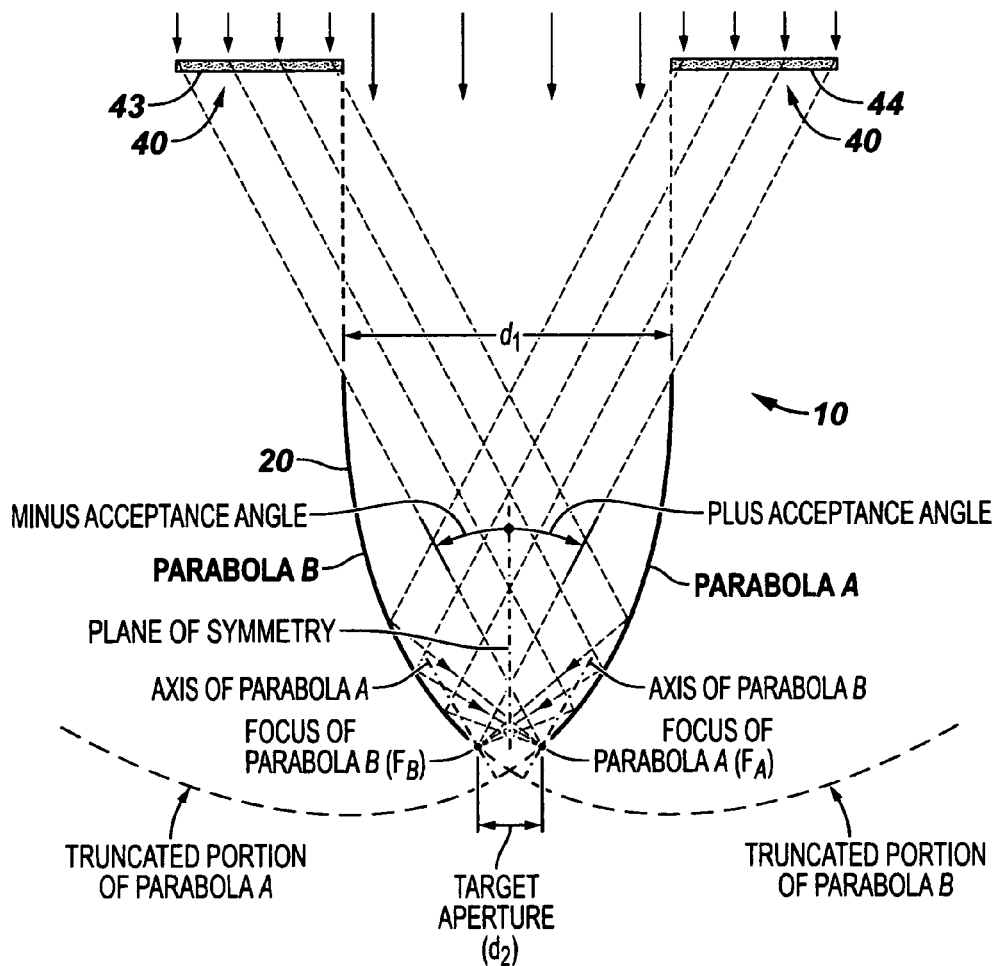
FIG. 1 is an end-view schematic diagram illustrating certain principles of one embodiment of the invention.

According to one embodiment of the invention, an apparatus 10 comprises a compound parabolic concentrating (CPC) trough 20, a target 30, a plurality of sunlight diverters 40, and a tracker 50. The CPC trough is for concentrating sunlight and is symmetric about an imaginary plane of symmetry. The target is for absorbing sunlight concentrated by the trough. The plurality of sunlight diverters is to increase the sunlight received by the trough. The tracker is to orient the trough so that the sun is positioned on the plane of symmetry.

In a preferred embodiment of the invention, the trough has a reflective inner surface 21 for concentrating sunlight entering the trough through an entry aperture of width $d_1$ at an upper end of the trough from points within a plus and a minus acceptance angle. The target is positioned near a lower end of the trough, preferably in a target aperture of width $d_2$. The plurality of sunlight diverters is positioned within the wedge-shaped volumes which are within the plus and minus acceptance angles above and laterally offset to the entry to the trough, so as not to block sunlight entering the trough parallel to the plane of symmetry. The diverters also preferably extend beyond the ends of the trough, especially where 1-axis tracking is employed. The tracker is preferably connected to the trough to rotate the trough about a longitudinal axis 22 of the trough.

The plurality of sunlight diverters is preferably positioned in a plane perpendicular to the plane of symmetry of the trough and parallel to a plane occupied by the target. The plurality of sunlight diverters divert impinging sunlight into the entry aperture of the trough from positions within the plus and minus acceptance angles, by bending the sunlight at an angle which is no greater than the acceptance angle.

The plurality of sunlight diverters is preferably divided in number between a first rectangular area 41 within the plus acceptance angle and a second rectangular area 42 within the minus acceptance angle. The first rectangular area is separated from the second rectangular area by a distance of at least the width of the entry aperture of the trough, preferably just slightly more than the width of the entry aperture. The first rectangular area and the second rectangular area are spaced from the plane of symmetry of the trough by a distance of at least one-half of $d_1$, preferably just slightly greater than one-half of $d_1$.

Figure 3:
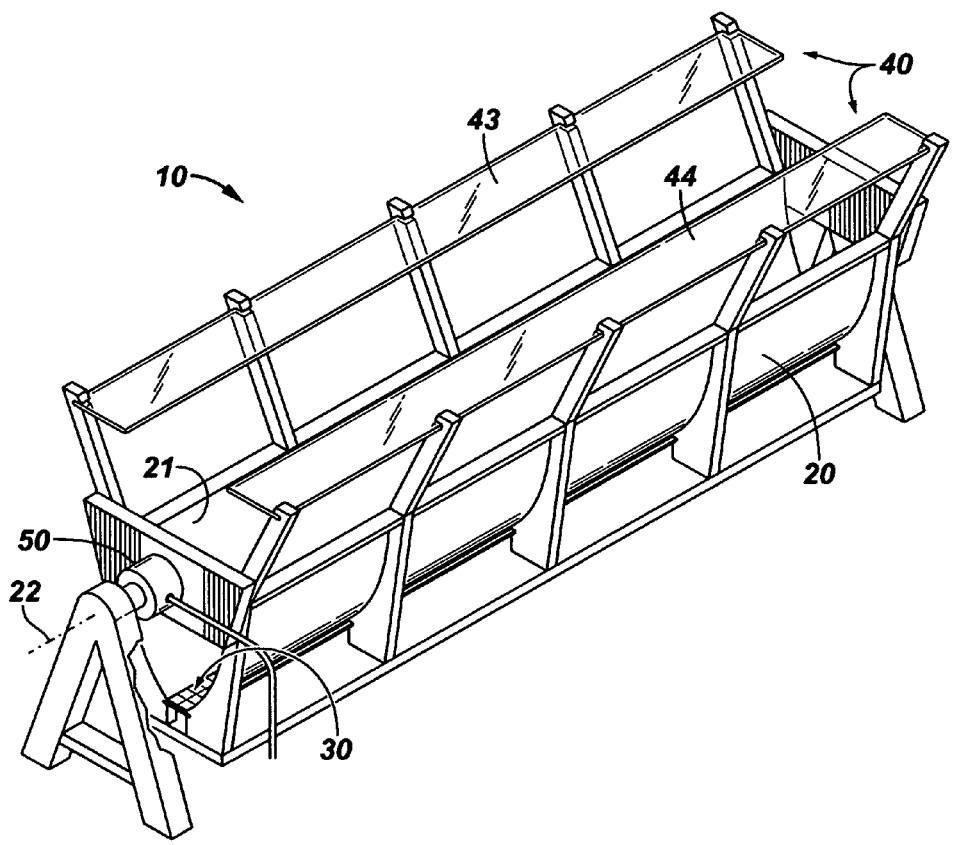
FIG. 3 is a pictorial representation of an embodiment of the invention according to the principles of FIG. 1.
Figure 4:
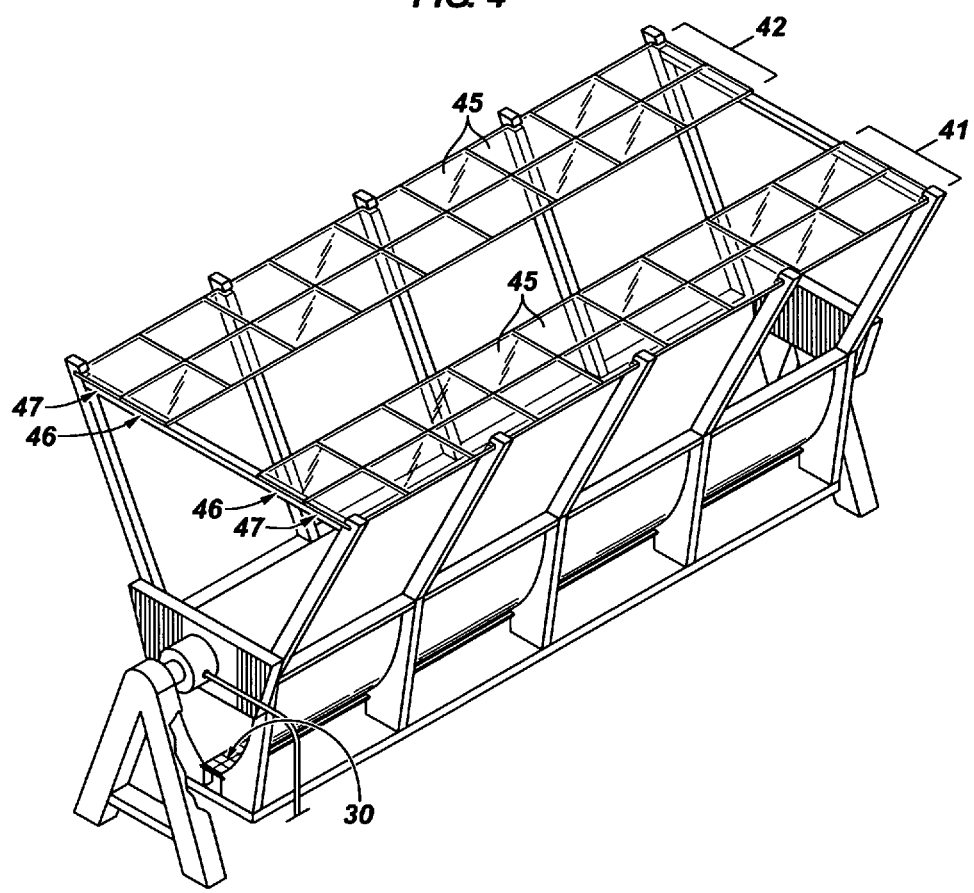
FIG. 4 is a pictorial representation of an embodiment of the invention according to the principles of FIG. 2.
Figure 5:
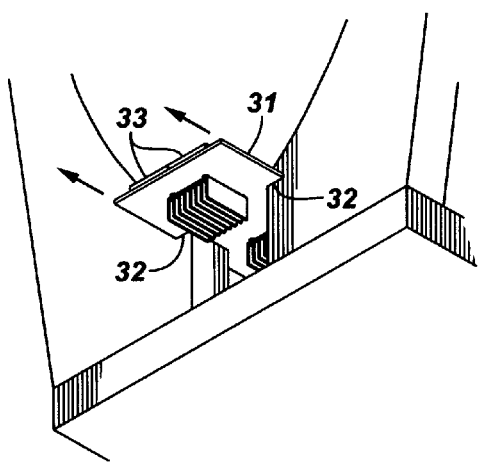
FIG. 5 is an enlarged pictorial view of a portion of the device shown in FIGS. 3 and 4 illustrating additional details.
Figure 6:
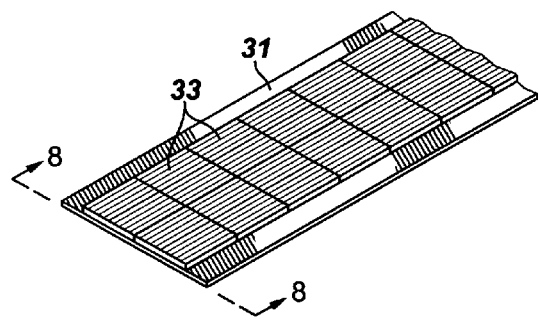
FIG. 6 is an enlarged pictorial view of a portion of the device shown in FIGS. 3 and 4 illustrating additional details.

The sunlight diverters positioned in the rectangular areas generally comprise linear nonimaging fresnel prism sheets, which are transparent sheets containing large numbers of parallel linear prismatic elements with constant prism and relief angles, or fresnel reflectors, which are mirrored strips. The diverters divert light by a generally uniform angle which is up to the acceptance angle of the trough. If desired, each of the first and the second rectangular area can be occupied by a single extruded fresnel prism sheet 43 or 44 as shown in FIG. 3. However, each of the first rectangular area and the second rectangular area can contain two or more identical rectangular flat linear fresnel prism sheets arranged in an array, such as square prism sheets 45, as it is possible to stamp such prism sheets from polymethylmethacrylate (PMMA) or other clear plastic. For example, each of the rectangular arrays can contain in the range of 10 to 1,000 fresnel prism sheets, arranged in a pane-like fashion.

Figure 2:
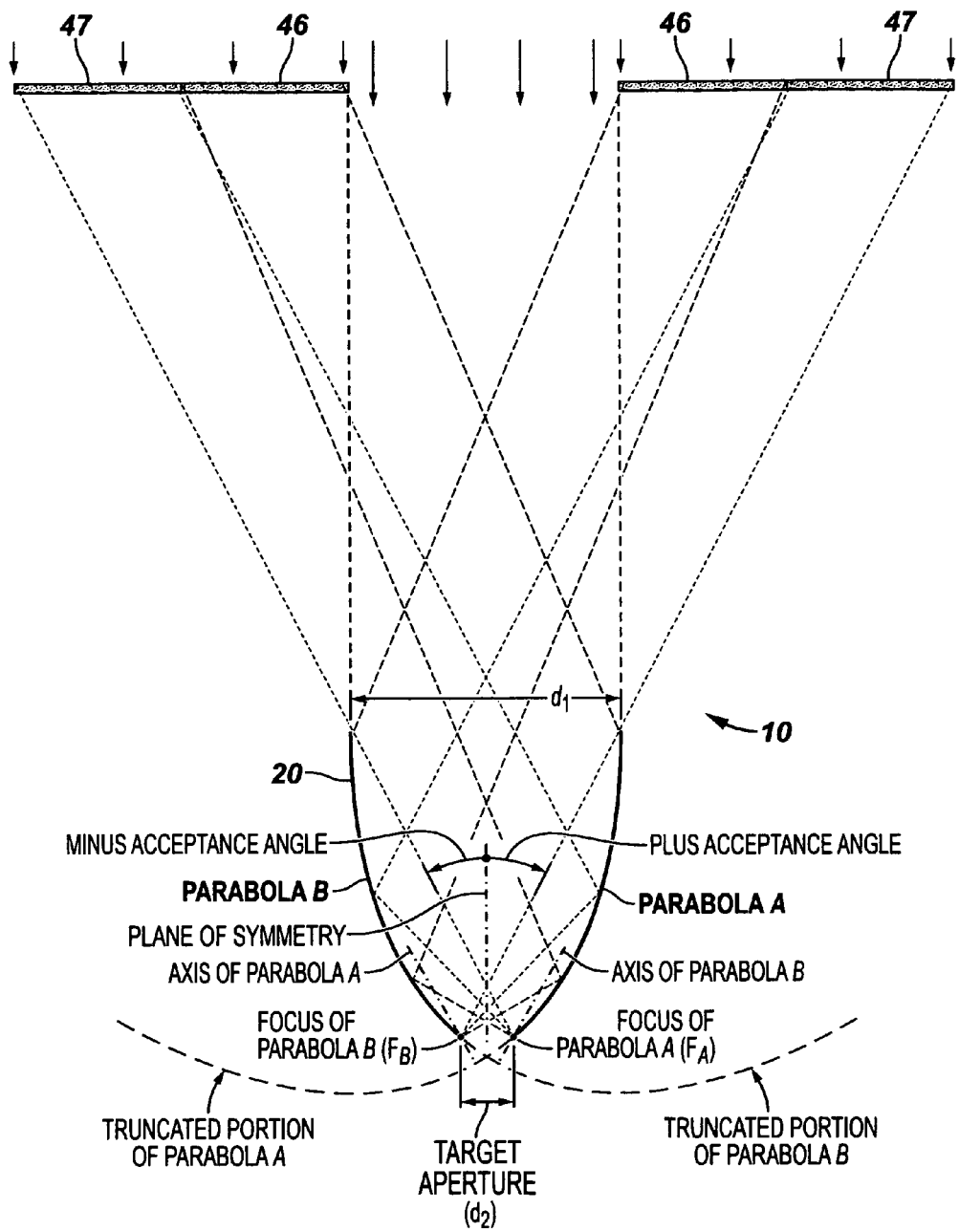
FIG. 2 is an end-view schematic diagram illustrating certain features of another embodiment of the invention.

Each of the rectangular areas will generally have a length which is at least as long as the length of the trough, preferably longer for one-axis tracking. The trough preferably has a length which is at least as long as the length of the target, preferably longer for one-axis tracking. The width of the rectangular areas can vary, for example, ranging from less than $d_1$ as shown in FIG. 1, or, with modification, to more than $d_1$ as shown in FIG. 2. The modification required to employ a diverter array having a width wider than the mouth of the trough and still capture all the light is for an inboard row of prism sheets 46 to divert incoming light at a smaller angle than an outboard row of prism sheets 47, so that all the light diverted by the rectangular array enters the inlet aperture from within the acceptance angle. The angle by which incoming light is diverted will be no greater than the acceptance angle of the trough, which is generally between 3 and 30 degrees, usually between 5 and 25 degrees, and typically between 10 and 20 degrees.

If light is diverted more than the acceptance angle, it will not be accepted by the trough. This can occur if the plane of symmetry of the trough is not in exact alignment with the sun. It is thus preferable to employ diverters which bend the incoming light slightly less than the acceptance angle of the trough, for example, at least about a degree or two less than the acceptance angle of the trough, and use a tracking system which is capable of holding the plane of symmetry of the trough within a degree or two of perfect alignment with the sun.

The target will generally comprise at least one metal plate 31, preferably a single plate, of width $d_2$, or slightly greater For example, aluminum, copper, brass and molybdenum are generally suitable. The plate is preferably slidably received in a track 32 at the bottom end of the trough, so that it can be easily removed for servicing or replacement, or to clean the trough. It can also be mounted to jacks, not shown, which can be retracted to clean the trough.

Where the target includes photovoltaic cells 33, these will generally be mounted in one or more rows above the plate, for example, by being attached to the bottom side of a transparent cover 34 over the plate, or on a layer or grid of dielectric material attached to the plate. At least one heat sink 35 is mounted to the back side of the plate, generally atop at least one heat pump, for example, a Peltier cooler 36, or the plate is traced with coolant lines. Around the Peltier cooler(s), the heat sink is generally thermally insulated from the back side of the plate by a layer of insulating material, not shown. The photovoltaic cells can be monocrystalline or polycrystalline silicon based cells, for example, or they can be of other types. As new types of cells become commercially available, the inventive device can be easily upgraded simply by replacing the plate and cells as a unit.

Figure 7:
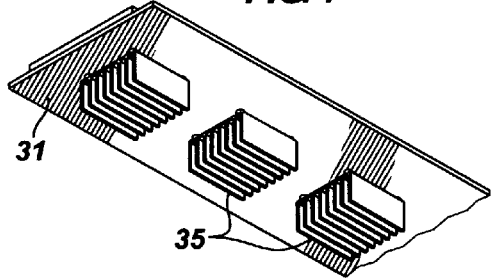
FIG. 7 is an enlarged pictorial view of a portion of the device shown in FIGS. 3 and 4 illustrating additional details.
Figure 8:
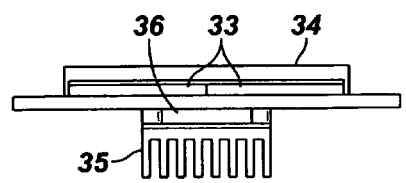
FIG. 8 is an end view along lines 8-8 of the device as shown in FIG. 6.

FIG. 7 illustrates a cooled plate which carries a row of photocells. Cooling can be provided by a row of Peltier devices mounted to the back side of the plate, the cells being mounted to the front side. The plate can be positioned in the bottom of a CPC trough, as described elsewhere herein. A suitably sized heat sink 35 is mounted to each Peltier device, and forced air circulation (not shown) can be provided if desired or needed.

Where the invention is employed with photovoltaic cells, it is expected good results will be provided where the trough and diverters are sized so that solar energy impinges on the photovoltaic cells at an intensity in the range of from 7 to 21 suns, i.e., the device provides a concentration ratio in the range of 7 to 21.

As an example, assume that each square meter of collection area (trough inlet area plus total diverter area, truncated to the length of the target) produces 350 watts of waste heat. About 10 watts of power would be required to remove that amount of waste heat using a reasonably efficient (35:1) Peltier device. The plate is constructed of a highly heat conductive material, such as copper, brass or aluminum, and the row of Peltier devices are positioned to draw the heat from the plate. The spacing of the Peltier devices is dependent on the area of the collector, the conductivity of the plate, and the size of the Peltier devices. In order to provide an adequate surface area to remove the excess heat, it may be necessary to employ Peltier devices which, for conventional cooling, would be considered over-sized, but under-powered, for example, 80 watt Peltier coolers drawing 2 watts of power. The coolers would generally be operated using a portion of the generated electricity to maintain the temperature of the photovoltaic cells between ambient and about 70 degrees C, as driven by economic considerations The efficiency of Silicon-based PV cells is increased at higher magnifications if excessive heat buildup is prevented. A cell which is, say, 15% efficient at 1 sun may be, say 17% efficient at 10 suns. On a per square meter inlet basis, capturing the light at 1× magnification would yield about 150 watts, while capturing it at 10× magnification would yield about 170 watts, a gain of 20 watts which would require an expenditure of 10 watts to power the Peltier device(s), netting about 10 watts/sq. meter.

For a 10× collector, stagnation temperature is on the order of 670 C, which is beyond the ignition temperature of many materials. For applications where ignitable materials may be wind blown into the trough, total enclosure of the trough by transparent sheeting may be necessary as a safety factor. For one-axis tracking applications, the diverters are preferably longer than the trough, which is preferably longer than the target.

Where the target is intended for heating fluids or driving a thermoelectric generator, for example, a Seebeck device, it will generally simply be painted flat black, and the concentrator will be constructed to operate at higher magnifications, for example, 20×. The Seebeck device, if used, would be mounted to the back side of the plate, sandwiched between the plate and a suitable heat sink. It is to be understood that a Seebeck device can be structurally identical to a Peltier device.

It is expected that good results can be provided with identically formed prism sheets by arranging the prism sheets in a pair of rectangular arrays, each array comprising a plurality of prism sheets, each array having a width and a length, the width of each array being substantially the same as a width for the mouth of the trough, so that the magnification provided by the trough is near tripled.

As an example, a double row of 6" square silicon PVCs 18 feet long will contain 72 cells, and produce 39.6 volts. The double row can be mounted on a cooled plate at the bottom of a truncated 3×CPC which has a 36 inch inlet. A pair of fresnel prism sheet arrays having a refraction angle of slightly less than the acceptance angle of the trough and each having a width of 36 inches can be mounted above the mouth of the trough at a height where the acceptance angle has spread to 36 inches. The resulting collector should have a peak output, ignoring losses, of about 2268 watts and be road-transportable. It is expected that such a device would provide good results when polar mounted (e.g., with the trough axis pointed at the north star in the northern hemisphere, or oriented N-S and inclined up at the N end at angle equal to the latitude of the site where mounted) and provided with a tracking device, which can be clock, sensor, and/or computer driven, to track the E-W apparent movement of the sun. The device can be E-W mounted if desired. A hydraulic system, for example, one which employs hydraulic cylinders driving a rack to rotate a pinion which is connected to the trough via a shaft is expected to provide long-lived results. The illustrated device mounts the trough in a rectangular cradle having axial shafts protruding from its ends. Suitable hydraulic rotary actuators are made by Parker Automation, for example.

While certain preferred embodiments of the invention have been described herein, the invention is not to be construed as being so limited, except to the extent that such limitations are found in the claims.

What is claimed is:

1. Apparatus comprising
   a compound parabolic concentrating trough for concentrating sunlight, said trough having a reflective inner surface for concentrating sunlight entering the trough through an entry aperture at an upper end of the trough from within a plus and a minus acceptance angle and directing said concentrated sunlight to a bottom of the trough, said compound parabolic concentrating trough being symmetric with respect to a plane of symmetry,
   a target positioned at the bottom of the trough for absorbing the sunlight concentrated by the trough,
   a plurality of sunlight diverters connected to the trough by a frame for rotation with the trough, said plurality of sunlight diverters being positioned within the plus and minus acceptance angles outside of the entry aperture to the trough and extending outwardly from the entry aperture, the plurality of sunlight diverters being positioned in a plane perpendicular to the plane of symmetry of the trough and parallel to a plane occupied by the target, for diverting sunlight impinging onto the plurality of sunlight diverters into the entry aperture of the trough when the sun is positioned on the plane of symmetry, to increase the sunlight received by the trough when the sun is positioned on the plane of symmetry, and
   a tracker connected to the trough to rotate the trough together with the plurality of sunlight diverters about a longitudinal axis of the trough to orient the trough so that the sun is positioned on the plane of symmetry and direct sunlight is received by the trough.

2. Apparatus as in claim 1 wherein
   the plurality of sunlight diverters is positioned in a plane perpendicular to the plane of symmetry of the trough and parallel to a plane occupied by the target.

3. Apparatus as in claim 2 wherein
   the plurality of sunlight diverters is divided between a first rectangular area within the plus acceptance angle and a second rectangular area within the minus acceptance angle, the first rectangular area being separated from the second rectangular area by a distance of at least the width of the entry aperture of the trough.

4. Apparatus as in claim 1 wherein the target comprises at least one plate having a front side and a back side, the front side of each plate facing the entry aperture of the trough, and at least one photovoltaic cell mounted on the front side of the at least one plate.

5. Apparatus as in claim 4 further comprising at least one heat pump mounted to the back side of the least one plate and a heat sink mounted to the back side of each heat pump.

6. A photovoltaic device as in claim 4
   wherein each of the first rectangular area and the second rectangular area contains two or more identical transparent rectangular flat linear fresnel prism sheets.

7. A photovoltaic device as in claim 6
   wherein the at least one plate is elongated and rectangularly shaped,
   wherein a plurality of photovoltaic cells is arranged in at least one row above the front side of the at least one plate in a rectangular array of photovoltaic cells having a width and a length,
   wherein the two or more identical transparent flat linear fresnel prism sheets are arranged in the form of a pair of elongated rectangular structures, each rectangular structure comprising at least one transparent prism sheet, the rectangular structures being spaced apart from each other by the width of the inlet aperture and having a width which is substantially the same as the inlet aperture and a length which is at least the same as length of the inlet aperture, and
   wherein the rectangular arrays refract normally incoming solar energy into the inlet aperture in a superposed pattern.

8. A photovoltaic device as in claim 7
   wherein the transparent fresnel prism sheets bend normal sunlight by an angle which is no greater than the acceptance angle for the compound parabolic concentrator so that sunlight falling normally on the transparent prism sheets is diffracted by the prism sheets and enters the inlet aperture of the trough within the acceptance angle for the trough and is concentrated to the bottom of the trough,
   the plate being positioned in the bottom of the trough in a plane parallel to the plane of the prism sheets, the front side of the plate facing the plane of the prism sheets, and
   at least one row of photovoltaic cells is positioned on the front side of the plate.

9. A photovoltaic device as in claim 8 wherein the transparent fresnel prism sheets are arranged in a pair of rectangular arrays, each array comprising a plurality of transparent prism sheets, each array having a width and a length, the width of each array being substantially the same as a width for the mouth of the trough, so that the magnification provided by the trough is near tripled by the presence of the fresnel prism sheets.

10. A photovoltaic device as in claim 8 in which solar energy impinges on the photovoltaic cells at an intensity in the range of from 7 to 21 suns.

11. Apparatus as in claim 1 wherein the target comprises an elongated rectangular plate constructed from a material selected from the group consisting of aluminum, brass, and copper; said plate having a front side and a back side;

a plurality of silicon-based photovoltaic cells positioned in a row on the front side of the plate, said photovoltaic cells being wired in series; and a plurality of thermoelectric coolers positioned in a row on the back side of the plate.

* * * * *